United States Patent
Vimercati

(10) Patent No.: US 11,043,253 B2
(45) Date of Patent: Jun. 22, 2021

(54) SELF REFERENCE FOR FERROELECTRIC MEMORY

(71) Applicant: Micron Technology, Inc., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/921,860

(22) Filed: Jul. 6, 2020

(65) Prior Publication Data

US 2020/0395058 A1    Dec. 17, 2020

Related U.S. Application Data

(62) Division of application No. 16/366,656, filed on Mar. 27, 2019, now Pat. No. 10,741,234, which is a
(Continued)

(51) Int. Cl.
*G11C 11/22* (2006.01)
*G11C 27/02* (2006.01)

(52) U.S. Cl.
CPC ........ *G11C 11/2273* (2013.01); *G11C 11/221* (2013.01); *G11C 27/024* (2013.01)

(58) Field of Classification Search
CPC .................. G11C 11/221; G11C 11/2273; G11C 11/5657
(Continued)

(56) References Cited

U.S. PATENT DOCUMENTS

| 5,995,407 A | 11/1999 | Kamp |
| 6,317,356 B1 | 11/2001 | Hoffmann et al. |

(Continued)

FOREIGN PATENT DOCUMENTS

| EP | 0293798 B2 | 12/1998 |
| JP | 2000293987 A | 10/2000 |
| JP | 2003297073 A | 10/2003 |

OTHER PUBLICATIONS

IPO, "Office Action," issued in connection with Taiwan Application No. 107106063, dated Jan. 28, 2019, 16 pgs.
(Continued)

*Primary Examiner* — Hoai V Ho
*Assistant Examiner* — Minh Dinh
(74) *Attorney, Agent, or Firm* — Holland & Hart LLP

(57) ABSTRACT

Methods, systems, and apparatuses for self-referencing memory cells are described. A reference value for a cell may be created through multiple sense operations on the cell. The cell may be sensed several times and an average of at least two sensing operations may be used as a reference for another sense operation. For example, the cell may be sensed and the resulting charge stored at a capacitor. The cell may be biased to one state, sensed a second time, and the resulting charge stored at another capacitor. The cell may be biased to another state, sensed a third time, and the resulting charge stored to another capacitor. The values from the second and third sensing operations may be averaged and used as a reference value in a comparison with value of the first sensing operation to determine a logic state of the cell.

20 Claims, 9 Drawing Sheets

Related U.S. Application Data division of application No. 15/442,182, filed on Feb. 24, 2017, now Pat. No. 10,290,341.

(58) Field of Classification Search
USPC .......................................................... 365/145
See application file for complete search history.

(56) References Cited

U.S. PATENT DOCUMENTS

| | | | |
|---|---|---|---|
| 6,459,609 | B1 | 10/2002 | Du |
| 6,873,536 | B2 | 3/2005 | Komatsuzaki |
| 7,113,437 | B2 | 9/2006 | Schweickert et al. |
| 7,269,049 | B2 | 9/2007 | Shiga et al. |
| 7,830,705 | B2 | 11/2010 | Jeong |
| 9,030,861 | B2 | 5/2015 | Yon |
| 9,552,864 | B1* | 1/2017 | Vimercati ........... G11C 11/2273 |
| 9,715,919 | B1 | 7/2017 | Ingalls et al. |
| 9,734,886 | B1* | 8/2017 | Derner ................ G11C 11/2273 |
| 9,767,879 | B2 | 9/2017 | Zhou et al. |
| 2006/0023484 | A1 | 2/2006 | Shiga et al. |

OTHER PUBLICATIONS

ISA/KR, International Search Report and Written Opinion of the International Searching Authority, Int'l Appl. No. PCT/US2018/018366, dated May 17, 2018, Korean Intellectual Property Office, Daejeon, Republic of Korea, 11 pgs.

European Patent Office, "Search Report," issued in connection with European Patent Application No. 18758498.2, dated Nov. 27, 2020 (10 pages).

Sharroush, Sherif M., "A Novel Self-Referenced Ferroelectric-Memory Readout Scheme," 2015 IEEE International Conference on Electronics, Circuits, and Systems (ICECS), IEEE, Dec. 6, 2015 (pp. 105-108).

JPO, "Notice of Rejection Ground," issued in connection with Japanese Patent Application No. 2019-545735, dated Sep. 23, 2020 (10 pages).

Korean Intellectual Property Office, "Notice of Reasons for Rejection," issued in connection with Korean Patent Application No. 10-2019-7026957, dated Aug. 27, 2020 (4 pages).

* cited by examiner

SELF REFERENCE FOR FERROELECTRIC MEMORY

CROSS REFERENCE

The present application for patent is a divisional of U.S. patent application Ser. No. 16/366,656 by Vimercati, entitled "Self-Reference for Ferroelectric Memory," filed Mar. 27, 2019, which is a divisional of U.S. patent application Ser. No. 15/442,182 by Vimercati, entitled "Self-Reference for Ferroelectric Memory," filed Feb. 24, 2017, assigned to the assignee hereof, and each of which is expressly incorporated by reference in its entirety herein.

BACKGROUND

The following relates generally to memory devices and more specifically to self-referencing for ferroelectric memory.

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of a ferroelectric capacitor as a storage device. FeRAM devices may thus have improved performance compared to other non-volatile and volatile memory devices. Some FeRAM sensing schemes, however, create excessive imprinting and fatigue on the memory cell and may otherwise be inaccurate because of variations in a reference value for the sensing scheme. This may reduce the reliability of sensing operations or may reduce the useful life of the memory cell.

BRIEF DESCRIPTION OF THE DRAWINGS

The disclosure herein refers to and includes the following figures.

DETAILED DESCRIPTION

Figure 1:
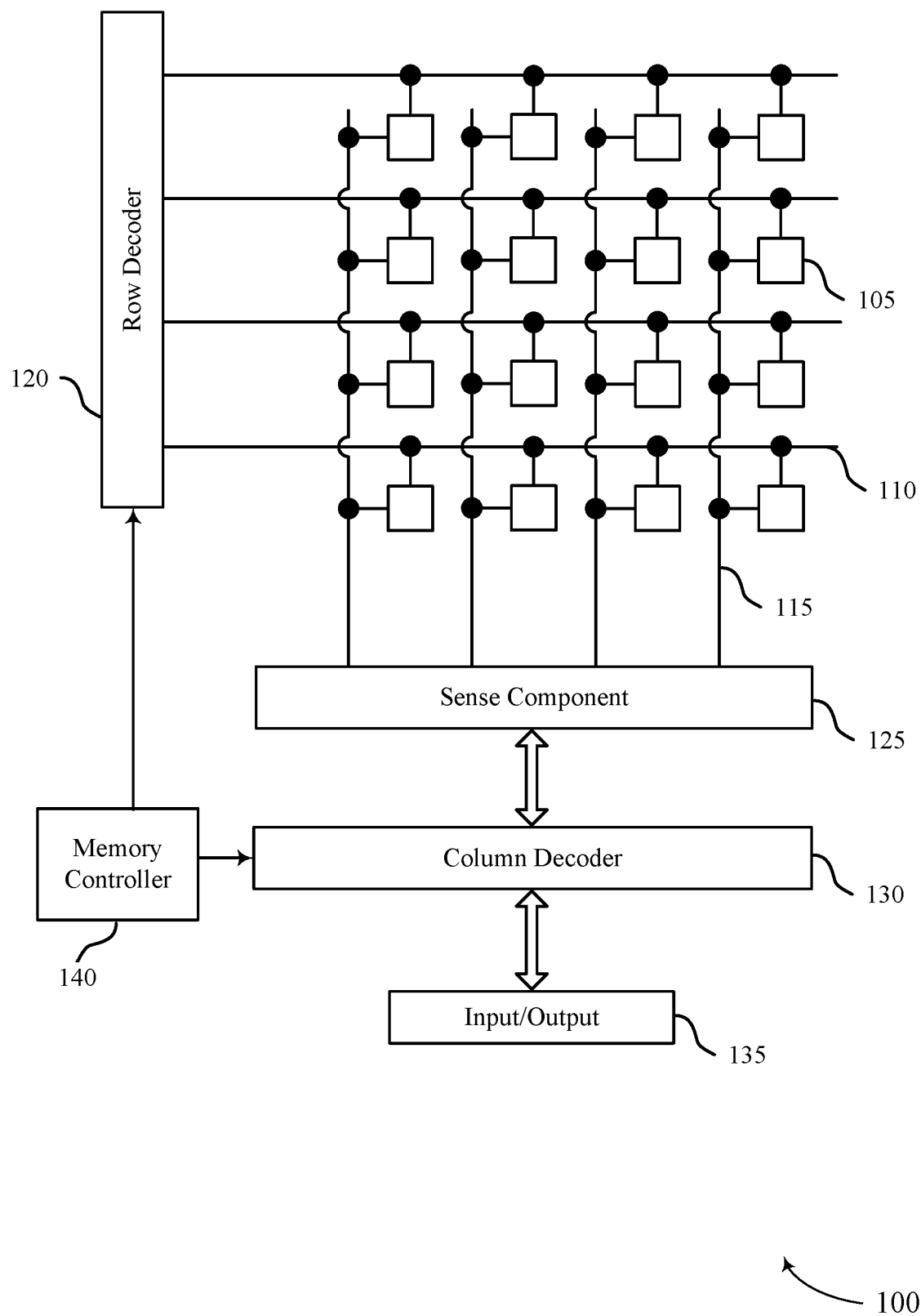
FIG. 1 illustrates an example memory array that supports self-referencing for ferroelectric memory in accordance with examples of the present disclosure.

Increased sensing reliability for memory cells, reductions in imprinting and fatigue, and increased memory-cell-useful-life may be realized with a sensing scheme that generates a self-reference through multiple sensing operations of a cell. A ferroelectric memory cell may be sensed multiple times to extract a series of charges. As described below, the charges may be stored with capacitors to be used in determining the stored logic state of the memory cell. The multiple sense operations may result in a reference value for the cell that is specific to the characteristics of that cell (a "self-reference"), and the cell may be written or biased to different states between sense operations, thus reducing cell imprinting and fatigue while increasing retention.

Memory cells, including FeRAM cells, within a memory array are often accessed by a word line and a digit line. Access may include writing to a cell (e.g., storing a logic state) or reading a cell (e.g., reading a stored logic state). Each cell may have a ferroelectric capacitor, or other storage component, that is used to store a logic value of the cell. A single digit line may connect many memory cells and may be connected to a sense amplifier that, when activated, may determine the stored logic state of a memory cell. To facilitate the sensing or reading of the stored logic state, the sense amplifier may generate a signal to determine, based on a series of stored charges, the logic value of the memory cell in its particular state.

In generating a signal, a number of capacitors may store a charge associated with a particular sense operation, as well as values pertaining to logic "1" and logic "0" states. These values may be referred to as reference "1" and reference "0." The values may then be provided to the sense amplifier to be used in the determination of the stored logic state, and potentially for subsequent writing operations. For example, an activated sense amplifier may compare a first stored charge, representative of a sensed logic state, with an average of a second and third stored charges—representative of reference "1" and reference "0," respectively.

By comparing the a charge associated with a sensed logic state with an average of charges associated with reference "1" and reference "0," a cell can be effectively sensed than, for example, using a static reference value or an array-wide reference value. That is, a logic value associated with a particular memory cell may be more easily determined by using the same cell as a reference in determining the logic value. For example, absent a self-reference, a reference value may sample the region in which a logic value "0" and a logic value "1" overlap. In this type of a sensing scheme, it may be difficult to determine the logic value of any one cell. However, by generating a self-reference value, a logic state of the cell may be determined by accounting for cell-specific variations or characteristics.

Features of the disclosure introduced above are further described below in the context of a memory array. Circuits, cell characteristics, and timing diagrams for memory cells and arrays that support self-references are then described. These and other features of the disclosure are further illustrated by and described with reference to apparatus diagrams, system diagrams, and flowcharts that relate to self-referencing for ferroelectric memory.

FIG. 1 illustrates an example memory array 100 that supports self-referencing for ferroelectric memory in accordance with examples of the present disclosure. Memory array 100 may also be referred to as an electronic memory apparatus. Memory array 100 includes memory cells 105 that are programmable to store different states. Each memory cell 105 may be programmable to store two states, denoted as a logic "0" and a logic "1." In some cases, memory cell 105 is configured to store more than two logic states. A memory cell 105 may include a capacitor to store a charge representative of the programmable states; for example, a charged and uncharged capacitor may represent two logic states, respectively. DRAM architectures may commonly use such a design, and the capacitor employed may include a dielectric material with linear electric polarization properties. By contrast, a ferroelectric memory cell may include a capacitor that has a ferroelectric as the dielectric material. Different levels of charge of a ferroelectric capacitor may represent different logic states. Ferroelectric materials have non-linear polarization properties; some details and advantages of a ferroelectric memory cell 105 are discussed below.

Operations such as reading and writing may be performed on memory cells 105 by activating or selecting the appropriate word line 110 and digit line 115. Word lines 110 may also be referred to as access lines and digit lines 115 may also be referred to as bit lines. Activating or selecting a word line 110 or a digit line 115 may include applying a voltage to the respective line. Word lines 110 and digit lines 115 are made of conductive materials. For example, word lines 110 and digit lines 115 may be made of metals (such as copper, aluminum, gold, tungsten, etc.), metal alloys, other conductive materials, or the like. According to the example of FIG. 1, each row of memory cells 105 is connected to a single word line 110, and each column of memory cells 105 is connected to a single digit line 115. Additionally, for example, each row of memory cells 105 and each column of memory cells 105 may be connected to an alternative line (e.g., a plate line). By activating one word line 110 and one digit line 115 (e.g., applying a voltage to the word line 110 or digit line 115), a single memory cell 105 may be accessed at their intersection. Accessing the memory cell 105 may include reading or writing the memory cell 105. The intersection of a word line 110 and digit line 115 may be referred to as an address of a memory cell.

In some architectures, the logic storing device of a cell, e.g., a capacitor, may be electrically isolated from the digit line by a selection component. The word line 110 may be connected to and may control the selection component. For example, the selection component may be a transistor and the word line 110 may be connected to the gate of the transistor. Activating the word line 110 results in an electrical connection or closed circuit between the capacitor of a memory cell 105 and its corresponding digit line 115. The digit line may then be accessed to either read or write the memory cell 105.

Accessing memory cells 105 may be controlled through a row decoder 120 and a column decoder 130. In some examples, a row decoder 120 receives a row address from the memory controller 140 and activates the appropriate word line 110 based on the received row address. Similarly, a column decoder 130 receives a column address from the memory controller 140 and activates the appropriate digit line 115. Thus, by activating a word line 110 and a digit line 115, a memory cell 105 may be accessed.

Upon accessing memory cell 105, it may be read, or sensed, by sense component 125 to determine the stored state of the memory cell 105. For example, after accessing the memory cell 105, the ferroelectric capacitor of memory cell 105 may discharge onto its corresponding digit line 115. Discharging the ferroelectric capacitor may be based on biasing, or applying a voltage, to the ferroelectric capacitor. The discharging may cause a change in the voltage of the digit line 115, which sense component 125 may compare to a reference voltage (not shown) in order to determine the stored state of the memory cell 105. For example, if digit line 115 has a higher voltage than the reference voltage, then sense component 125 may determine that the stored state in memory cell 105 was a logic "1" and vice versa. As described herein, the charge resulting from a sense operation of a cell 105 may be stored in a capacitor (not shown). Sense component 125 may compare an average value of multiple sense operations to another sense operation in order to determine a logic value for a cell 105 that is based on a reference value that is specific to that cell 105. Sense component 125 may, as described below with reference to FIG. 4, use values stored in various capacitors.

Sense component 125 may include various transistors or amplifiers in order to detect and amplify a difference in the signals, which may be referred to as latching. Sense component 125 may also include one or more sense capacitors, as described with reference to FIG. 4. The detected logic state of memory cell 105 may then be output through column decoder 130 as output 135.

A memory cell 105 may be set, or written, by activating the relevant word line 110 and digit line 115. As discussed above, activating a word line 110 electrically connects the corresponding row of memory cells 105 to their respective digit lines 115. By controlling the relevant digit line 115 while the word line 110 is activated, a memory cell 105 may be written—i.e., a logic value may be stored in the memory cell 105. Column decoder 130 may accept data, for example input 135, to be written to the memory cells 105. A ferroelectric memory cell 105 may be written by applying a voltage across the ferroelectric capacitor.

As described herein, a memory cell 105 may be sensed several times and an average of at least two sensing operations may be used as a reference for another sense operation. This type of scheme may involve a sequence of reading from and writing to the cell 105. For example, a cell 105 may be sensed and the resulting charge stored at a capacitor (not shown). The cell may be biased to one state, sensed a second time, and the resulting charge stored at another capacitor (not shown). The cell may be biased to another state, sensed a third time, and the resulting charge stored to another capacitor (not shown). The values from the second and third sensing operations may be averaged and used as a reference value in a comparison with value of the first sensing operation to determine a logic state of the cell. This process is discussed in more detail below.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state. So the logic state may be re-written after a sense operation. Additionally, activating a single word line 110 may result in the discharge of all memory cells in the row; thus, several or all memory cells 105 in the row may need to be re-written.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM arrays, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery.

As discussed below, ferroelectric memory cells 105 may have beneficial properties that may result in improved performance relative to other memory architectures. For example, because ferroelectric memory cells tend to be less susceptible to degradation of stored charge, a memory array 100 that employs ferroelectric memory cells 105 may require fewer or no refresh operations, and may thus require less power to operate. Additionally, employing sensing schemes described herein in which cells are accessed and written several time during each sensing operation may allow for greater retention capability of the memory cell 105, while reducing imprinting and fatigue.

The memory controller 140 may control the operation (e.g., read, write, re-write, refresh, etc.) of memory cells 105 through the various components, such as row decoder 120, column decoder 130, and sense component 125. Memory controller 140 may generate row and column address signals in order to activate the desired word line 110 and digit line 115. Memory controller 140 may also generate and control various voltage potentials used during the operation of memory array 100. In general, the amplitude, shape, or duration of an applied voltage discussed herein may be adjusted or varied and may be different for the various operations for operating memory array 100. Furthermore, one, multiple, or all memory cells 105 within memory array 100 may be accessed simultaneously. For example, multiple or all cells of memory array 100 may be accessed simultaneously during a reset operation in which all memory cells 105, or a group of memory cells 105, are set to a single logic state.

Figure 2:
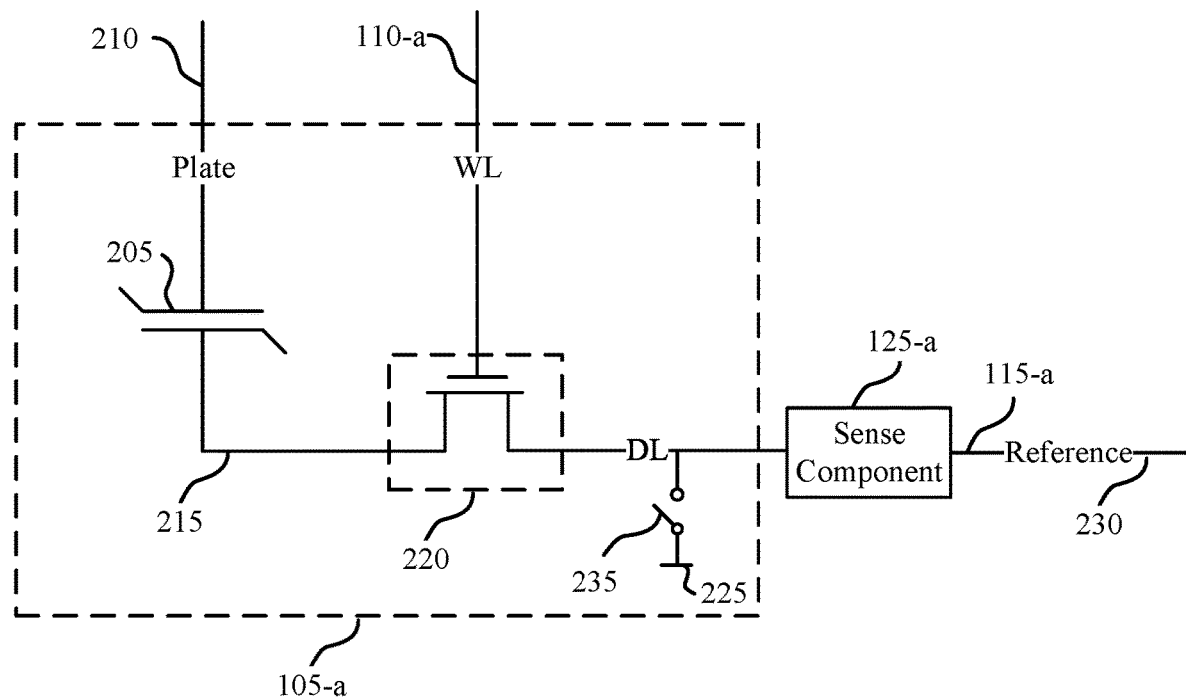
FIG. 2 illustrates an example circuit that supports self-referencing for ferroelectric memory in accordance with examples of the present disclosure.

FIG. 2 illustrates an example circuit 200 that supports self-referencing for ferroelectric memory in accordance with examples of the present disclosure. Circuit 200 includes a ferroelectric memory cell 105-a, word line 110-a, digit line 115-a, and sense component 125-a, which may be examples of a memory cell 105, word line 110, digit line 115, and sense component 125, respectively, as described with reference to FIG. 1. Circuit 200 also includes selection component 220, virtual ground 225, reference line 230, and a logic storage component such as capacitor 205, which may include two conductive terminals, including plate 210 and cell bottom 215. In the example of FIG. 2, the terminals of capacitor 205 are separated by an insulating ferroelectric material. As described above, various states may be stored by charging or discharging capacitor 205, i.e., polarizing the ferroelectric material of capacitor 205.

The stored state of capacitor 205 may be read or sensed by operating various elements represented in circuit 200. As depicted, capacitor 205 may be in electronic communication with digit line 115-a. Capacitor 205 may thus be isolated from digit line 115-a when selection component 220 is deactivated, and capacitor 205 can be connected to digit line 115-a when selection component 220 is activated to select the ferroelectric memory cell 105-a. In other words, ferroelectric memory cell 105-a may be selected using selection component 220 that is in electronic communication with ferroelectric capacitor 205, where ferroelectric memory cell 105-a includes selection component 220 and ferroelectric capacitor 205. Activating selection component 220 may be referred to as selecting memory cell 105-a. In some cases, selection component 220 is a transistor and its operation is controlled by applying a voltage to the transistor gate, where the voltage magnitude is greater than the threshold magnitude of the transistor. Word line 110-a may activate selection component 220; for example, a voltage applied to word line 110-a is applied to the transistor gate, connecting capacitor 205 with digit line 115-a.

In other examples, the positions of selection component 220 and capacitor 205 may be switched, such that selection component 220 is connected between plate 210 line and cell plate 215 and such that capacitor 205 is between digit line 115-a and the other terminal of selection component 220. In this embodiment, selection component 220 may remain in electronic communication with digit line 115-a through capacitor 205. This configuration may be associated with alternative timing and biasing for read and write operations.

Due to the ferroelectric material between the plates of capacitor 205, and as discussed in more detail below, capacitor 205 may not discharge upon connection to digit line 115-a. Instead, plate 210 may be biased by an external voltage, resulting in a change in the stored charge on capacitor 205. The change in stored charge corresponds to a logic state of capacitor 205. A voltage applied to capacitor 205 changes the charge of capacitor 205. The change in stored charge may then be compared to one or more reference charges (e.g., reference "0" or reference "1") by sense component 125-a in order to determine the stored logic state in memory cell 105-a.

To write memory cell 105-a, a voltage may be applied to capacitor 205. Various methods may be used. For example, selection component 220 may be activated through word line 110-a in order to electrically connect capacitor 205 to digit line 115-a. A voltage may be applied to capacitor 205 by controlling the voltage of plate 210 and cell bottom 215 through digit line 115-a. Two write a logic "0," plate 210 may be taken high—i.e., a positive voltage may be applied—and cell bottom 215 may be taken low—i.e., connected to virtual ground 225, grounded, or negative voltage may be applied. The opposite process is performed to write a logic "1"—i.e., plate 210 is taken low and cell bottom 215 is taken high.

The change in voltage of digit line 115-a may depend on its intrinsic capacitance. That is, as charge flows through digit line 115-*a*, some finite charge may be stored in digit line 115-*a* and the resulting voltage depends on the intrinsic capacitance. The intrinsic capacitance may depend on physical characteristics, including the dimensions, of digit line 115-*a*. Digit line 115-*a* may connect many memory cells 105 so digit line 115-*a* may have a length that results in a non-negligible capacitance (e.g., on the order of picofarads (pF)). The resulting voltage of digit line 115-*a* may then be compared to a reference (e.g., a voltage of reference line 230) by sense component 125-*a* in order to determine the stored logic state in memory cell 105-*a*. Other sensing processes may be used.

Sense component 125-*a* may include various transistors or amplifiers to detect and amplify a difference in signals, which may be referred to as latching. Sense component 125-*a* may include a sense amplifier that receives and compares the voltage of digit line 115-*a* and reference line 230, which may be a reference voltage. Additionally, sense component 125-*a* may compare, for example, charges stored at various capacitors (not shown), as is, as described with reference to FIG. 4. The sense amplifier output may be driven to the higher (e.g., a positive) or lower (e.g., negative or ground) supply voltage based on the comparison. For instance, if digit line 115-*a* has a higher voltage than reference line 230, then the sense amplifier output may be driven to a positive supply voltage.

In some cases, the sense amplifier may additionally drive digit line 115-*a* to the supply voltage. Sense component 125-*a* may then latch the output of the sense amplifier and/or the voltage of digit line 115-*a*, which may be used to determine the stored state in memory cell 105-*a*, e.g., logic "1." Alternatively, if digit line 115-*a* has a lower voltage than reference line 230, the sense amplifier output may be driven to a negative or ground voltage. Sense component 125-*a* may similarly latch the sense amplifier output to determine the stored state in memory cell 105-*a*, e.g., logic "0." The latched logic state of memory cell 105-*a* may then be output, for example, through column decoder 130 as output 135 with reference to FIG. 1.

As described here, the reference value may be a voltage that results from averaging the charge from successive sense operations. Averaging the charge from successive sense operations may entail calculating a numerical average of the charges. Alternatively, averaging the charge from successive sense operations may pertain to charge sharing. So unlike schemes in which a reference value is static or array-wide, reference line 230 may be configured with a cell-specific value or self-reference. Reference line 230 may include or represent a coupling with several capacitors (not shown), as described with reference to FIG. 4.

Virtual ground 225 may provide a virtual ground to digit line 115-*a*. Virtual ground 225 may be separated from digit line 115-*a* through a switch 235. In some examples, switch 235 may be a transistor, or may be a transistor connected in series with sense component 125-*a* and digit line 115-*a*. In some cases the transistor comprises a p-type FET.

Figure 3:
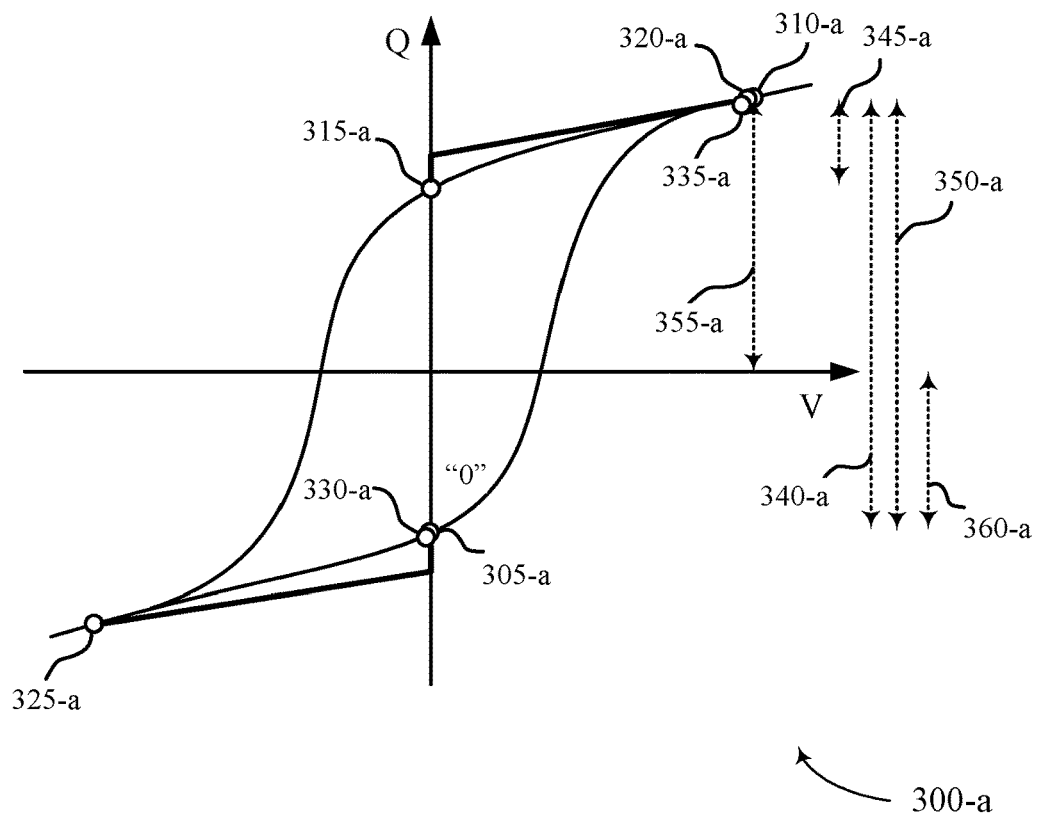
FIG. 3 illustrates example hysteresis curves for a cell that support self-referencing in accordance with examples of the present disclosure.
Figure 3:
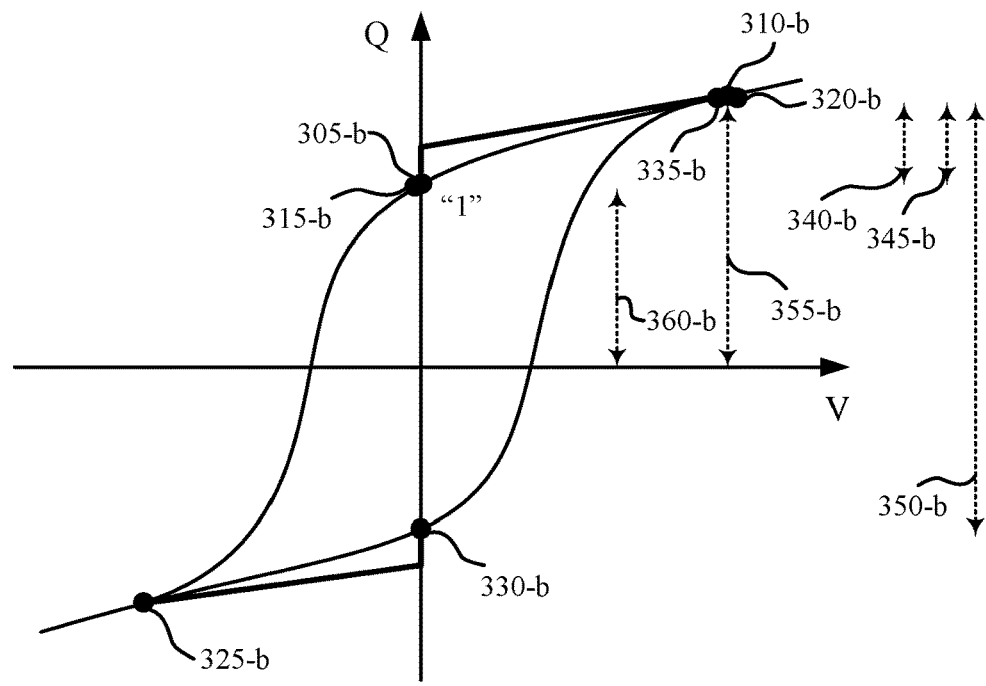

FIG. 3 illustrates an example of non-linear electrical properties with hysteresis curves 300-*a* and 300-*b* for a ferroelectric memory cell that is operated in accordance with examples of the present disclosure. Hysteresis curves 300-*a* and 300-*b* illustrate writing and reading processes. According to the example of FIG. 3, hysteresis curve 300-*a* may represent reading logic state "0" and hysteresis curve 300-*b* may represent reading logic state "1." Hysteresis curves 300-*a* and 300-*b* depict the charge, Q, stored on a ferroelectric capacitor (e.g., capacitor 205 of FIG. 2) as a function of a voltage difference, V.

A ferroelectric material is characterized by a spontaneous electric polarization, i.e., it maintains a non-zero electric polarization in the absence of an electric field. Example ferroelectric materials include barium titanate ($BaTiO_3$), lead titanate ($PbTiO_3$), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in DRAM arrays. This may reduce the need to perform refresh operations as described above for some DRAM architectures.

Hysteresis curves 300-*a* and 300-*b* may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300-*a* and 300-*b* represent a voltage difference across the capacitor and are directional. For example, a positive voltage may be realized by applying a positive voltage to the terminal in question (e.g., a cell plate 210 of FIG. 2) and maintaining the second terminal (e.g., a cell bottom 215 of FIG. 2) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-*a* and 300-*b*.

As depicted in hysteresis curve 300-*a*, the ferroelectric material may maintain a negative polarization with a zero voltage difference, resulting in possible charged state 305-*a*. Additionally, as depicted in hysteresis curve 300-*b*, the ferroelectric material may maintain a positive polarization with a zero voltage difference, resulting in possible charged state 305-*b*. According to the examples of FIG. 3, charge state 305-*a* represents a logic "0" state and charge state 305-*b* represents a logic "1" state. Additionally, charge states 305-*a* and 305-*b* may be referred to as the remnant polarization (Pr) values, i.e., the polarization (or charge) that remains upon removing an external bias (e.g., a voltage). In some examples, the logic values of the respective charge states may be reversed to accommodate other schemes for operating a memory cell.

A logic "0" or "1" may be written to the memory cell by controlling the electric polarization of the ferroelectric material, and thus the charge on the capacitor terminals, by applying a voltage. For example, in FIG. 300-*a*, applying a net positive voltage across the capacitor results in charge accumulation until charge state 310-*a* is reached. This charge, for example, may be representative of a sensed logic state corresponding to signal 340-*a*, and the charge may be stored in a sense capacitor (e.g., sense capacitor 405 of FIG. 4). Upon removing the voltage, charge state 310-*a* follows a path on curve 300-*a* until it reaches charge state 315-*a* at zero volts. Charge state 320-*a* may be attained by applying a net positive voltage across the capacitor. This voltage, for example, may be equal to the voltage applied to reach charge state 310-*a*. This charge, for example, may be representative of reference "0" signal 345-*a*, and the charge may be stored in another sense capacitor (e.g., sense capacitor 410 of FIG. 4). Applying a net negative voltage to a capacitor with charge state 320-*a* may result in charge state 325-*a*, and removing the net negative voltage from the capacitor with charge state 325-*a* may result in charge state 330-*a* at zero volts. Applying a positive voltage to the capacitor with charge state 330-*a* may result in charge state 335-*a*, which may be representative of reference "1" signal 350-*a*, and the charge may be stored in another sense capacitor (e.g., sense capacitor 415 of FIG. 4). This charge may be associated with or proportional to the voltage applied to attain charge state 310-*a* and 320-*a*. Additionally, the applied net positive voltage and the applied net negative voltage may be the same voltage value, with each having an opposite polarity.

Similarly, in FIG. 300-*b*, applying a net positive voltage across the capacitor may result in charge accumulation until charge state 310-*b* is reached. This charge, for example, may be representative of a sensed logic state corresponding to signal 340-*b*, and the charge may be stored in a sense capacitor (e.g., sense capacitor 405 of FIG. 4). Upon removing the voltage, charge state 310-*b* follows a path along curve 300-*b* until it reaches charge state 315-*b* at zero volts. Charge state 320-*b* may be attained by applying a net positive voltage across the capacitor. This charge, for example, may be representative of reference "0" signal 345-*b*, and the charge may be stored in a sense capacitor (e.g., sense capacitor 410 of FIG. 4). Applying a net negative voltage to a capacitor with charge state 320-*b* may result in charge state 325-*b*, and removing the net negative voltage from the capacitor with charge state 325-*b* may result in charge state 330-*b* at zero volts. Applying a positive voltage to capacitor with charge state 330-*b* may result in charge state 335-*b*, which may be representative of reference "1" signal 350-*b*, and the charge may be stored in a sense capacitor (e.g., sense capacitor 415 of FIG. 4). Additionally, the applied net positive voltage and the applied net negative voltage may be the same voltage value, with each having an opposite polarity.

As depicted in the example of FIG. 300-*a*, signal 360-*a* may be provided to a sense amplifier (e.g., sense component 125-*b* of FIG. 4) for use in determining the sensed logic value of the memory cell. Signal 360-*a* is determined by providing, for example, the charge associated with a sensed logic state of signal 340-*a* and a reference value 355-*a* to a sense amplifier (e.g., sense component 125-*b* of FIG. 4). Reference value 355-*a* may be an average of the charges associated with reference "0" signal 345-*a* and reference "1" signal 350-*a*.

As depicted in the example of FIG. 300-*b*, signal 360-*b* may be provided to a sense amplifier (e.g., sense component 125-*a* of FIG. 2) for use in determining the sensed logic value of the memory cell. Signal 360-*b* may be determined by providing, for example, the charge associated with sensed logic state corresponding to signal 340-*b* and a reference value 355-*b* to a sense amplifier. Reference value 355-*b* may be an average of the charges associated with reference "0" signal 345-*b* and reference "1" signal 350-*b*.

As discussed above, reading a memory cell that does not use a ferroelectric capacitor may degrade or destroy the stored logic state. A ferroelectric memory cell, however, may maintain the initial logic state after a read operation. For example, if charge state 305-*b* is stored, the charge state may follow a path to charge state 310-*b* during a sense operation and, after removing the voltage, the charge state may return to initial charge state 305-*b* by following a path in the opposite direction.

Figure 4:
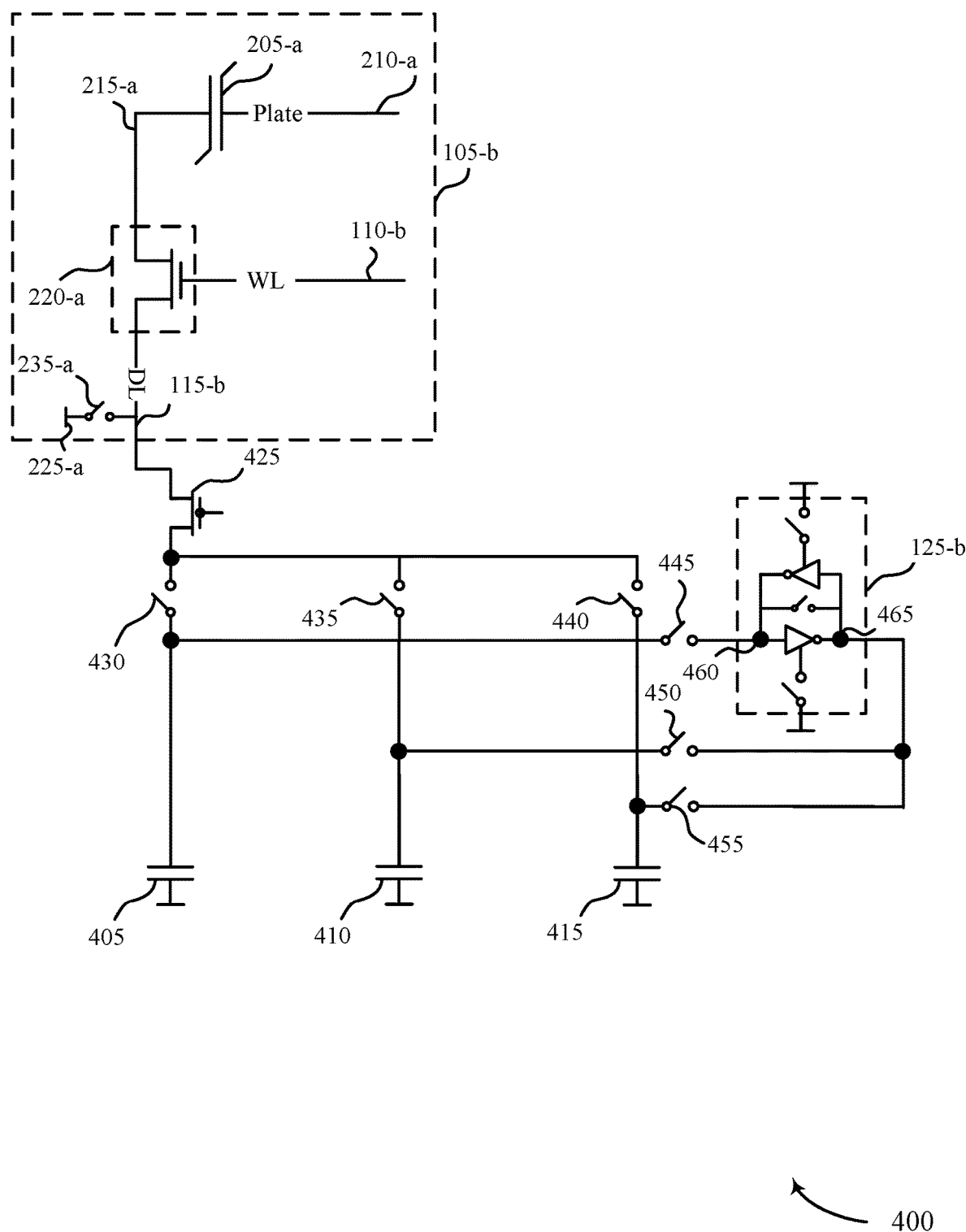
FIG. 4 illustrates an example circuit that supports self-referencing for ferroelectric memory in accordance with examples of the present disclosure.

FIG. 4 illustrates an example circuit 400 that supports self-referencing for ferroelectric memory in accordance with an example of the present disclosure. Circuit 400 includes sense capacitors 405, 410, and 415, sense amplifier (e.g., sense component 125-*b*), transistor 425, and switching components 430, 435, 440, 445, 450, and 455. Transistor 425 may also be referred to as switching component 425. Sense component 125-*b* may include node 460 and node 465, which may be referred to as input node and reference node, respectively. In some examples, switching components 430, 435, 440, 445, 450, and 455 may be transistors. Switching components 430, 435, and 440 may be referred to as a first set of switching components, and switching components 445, 450, and 455 may be referred to as a second set of switching components.

Additionally, circuit 400 includes memory cell 105-*b*, word line 110-*b*, digit line 115-*b*, sense component 125-*b*, capacitor 205-*a*, plate 210-*a*, cell bottom 215-*a*, selection component 220-*a*, virtual ground 225-*a*, which may be in electronic communication with digit line 115-*b* via a switch 235-*a* (e.g., an additional switching component). These various components may be examples of components as described with reference to FIGS. 1 and 2. Ferroelectric memory cell 105-*a* may be selected using selection component 220-*a* that is in electronic communication with ferroelectric capacitor 205, where ferroelectric memory cell 105-*a* includes selection component 220-*a* and ferroelectric capacitor 205-*a*. For example, selection component 220-*a* may be a transistor (e.g., a FET) and may be activated by a voltage applied to a gate of a transistor using word line 110-*b*.

A voltage may be applied to ferroelectric capacitor 205-*a* based on selecting ferroelectric memory cell 105-*b*, which may result in a charge on digit line 115-*b*. Transistor 425 may be a gate, where the voltage magnitude of the digit line 115-*b* may be greater than the threshold magnitude of the transistor 425. The first set of switching components may be connected in a series configuration with transistor 425, which may be connected in a series configuration with three other switching components, each connected in a series configuration with one of sense capacitors 405, 410, and 415. When switching component 430 is closed, the sensed charge (e.g., sensed signal 340-*a* of FIG. 3) may be stored at sense capacitor 405. The stored charge at sense capacitor 405 corresponds to a value associated with the sensed logic state of the ferroelectric memory cell 105-*b*. Subsequently, additional voltages may be applied across capacitor 205-*a* resulting in charges corresponding to a reference "0" signal (e.g., reference "0" signal 345-*a* of FIG. 3) and a reference "1" signal (e.g., reference "1" signal 350-*a* of FIG. 3). Such charges may be stored, for example, at sense capacitors 410 and 415, respectively.

A charge stored at sense capacitor 405 may be provided to sense component 125-*b* for use in determining the logic value of memory cell 105-*b*. Additionally, the charges stored at sense capacitors 410 and 415, respectively, may also be provided to sense component 125-*b*. The charges stored at sense capacitors 410 and 415, for example, may be averaged to determine a reference value (e.g., reference value 355-*a* of FIG. 3) before being compared with the charged stored at sense capacitor 405. In some instances, comparing the charge stored at sense capacitor 405 to the reference value includes activating sense component 125-*b*, which is in electronic communication with sense capacitor 405.

Switching components 430, 435, and 440 are opened or closed to facilitate the charges being provided to the sense capacitors and sense component 125-*b*. For example, when storing a charge to sense capacitor 405, switching component 430 may be closed and switching components 435 and 440 may be open. Similarly, when storing a charge to sense capacitor 410 or 415, switching components 430 may be open and switching component 435 or 440, depending on the charge being stored, may be opened or closed. Additionally, switching components 445 450, and 455 control charges being provided to sense component 125-*b*. For example, when providing the charges stored at sense capacitors 410 and 415, respectively, switching components 450 and 455 may be closed and switching component 445 may be open. Additionally, when providing the charge stored at sense capacitor 405 to the sense amplifier, switching components 450 may be open and switching component 445 may be closed.

Charges stored at sense capacitors 405, 410, and 415 are provided to sense component 125-*b* to calculate both a reference value and a signal (e.g., signal 360-*a* of FIG. 3). These charge values may be provided to sense component 125-*b*, which may compute an average of the values, representative of the reference value. The reference value is then compared with the charge state stored at sense capacitor 405 to calculate the signal, which may be used in determining the logic value associated with the memory cell. For example, the charges stored at sense capacitors 410 and 415 may be used to calculate a reference value and then compared to the charge stored at sense capacitor 405. The reference value may be calculated as a numerical average of the charges stored at sense capacitors 410 and 415. Alternatively, for example, the reference value may be calculated based on charge sharing between the charges stored at sense capacitors 410 and 415. The logic value of the memory cell may be determined based on the difference between the reference value and the voltage resulting from charge stored at sense capacitor 405.

Figure 5:
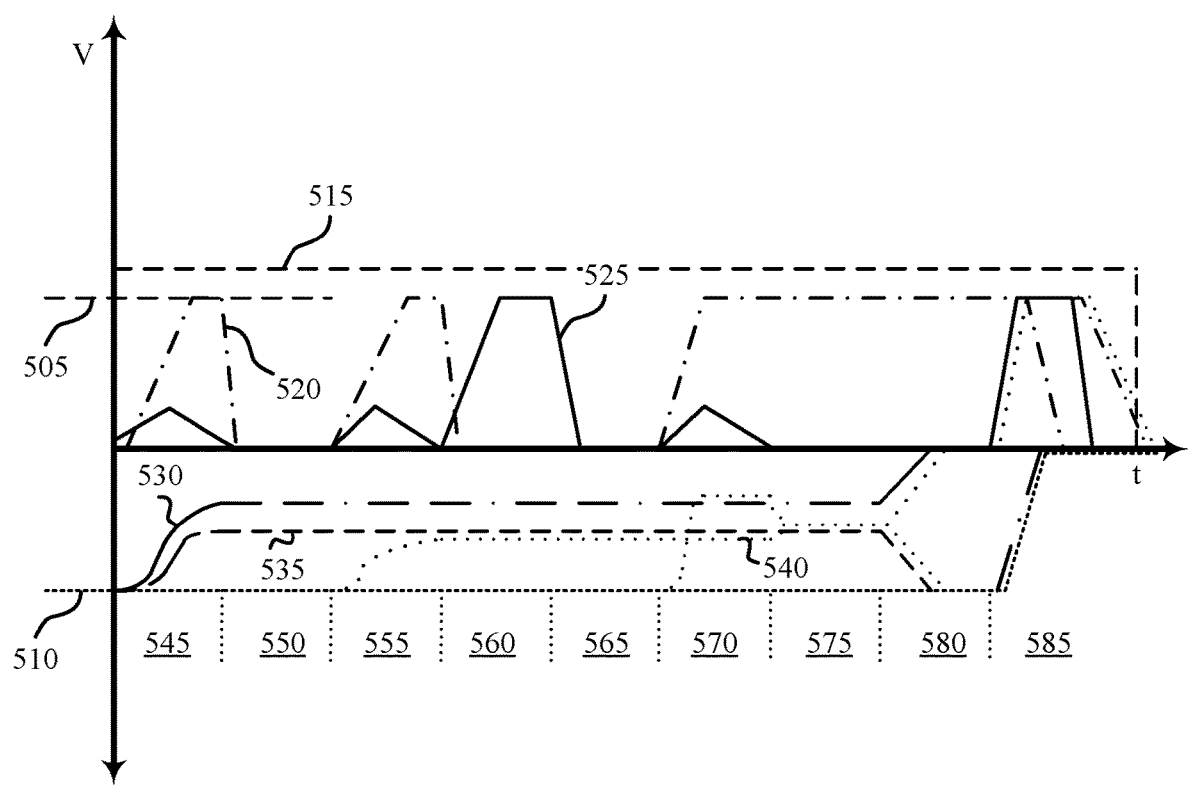
FIG. 5 illustrates a timing diagram for operating a ferroelectric memory cell with self-referencing for ferroelectric memory in accordance with examples of the present disclosure.

FIG. 5 illustrates an example of a timing diagram 500 for operating a ferroelectric memory cell that supports self-referencing for ferroelectric memory. Timing diagram includes voltage (V) along the vertical axis and time (t) along the horizontal axis; and diagram 500 may represent at least a portion of a read operation. The voltages of various components as a function of time are also represented on timing diagram 500. For example, timing diagram 500 includes read voltage 505, negative voltage 510, word line voltage 515, plate line voltage 520, digit line voltage 525, reference "1" voltage 530, reference "0" voltage 535, and reference value voltage 540. Timing diagram 500 may result from operating circuit 400 described with reference to FIG. 4, and the following discussion is in the context of components depicted in FIG. 4.

As discussed above, various states can be stored by capacitor 205-*a*; capacitor 205-*a* may be initialized to a first state or a second state. For example, capacitor 205-*a* may be initialized to a first state or a second state by activating selection component 220-*a* and applying a voltage (e.g., a write voltage) to capacitor 205-*a*. The application of the voltage to capacitor 205-*a* may be based at least in part on the activation of the selection component 220-*a*. To read the state stored by capacitor 205-*a*, the voltage across capacitor 205-*a* may be shared by the digit line (e.g., by activating the selection component 220-*a*), which in turn may be sampled by the sense component 125-*b*. The voltage applied across capacitor 205-*a* may be temporarily stored at sense capacitor 405. Activating selection component 220-*a* may include applying an activation voltage to selection component 220-*a*; for example, cell 105-*b* may be selected by applying word line voltage 515 to the gate of selection component 220-*a*. Activating selection component 220-*a* may electrically connect capacitor 205-*a* to digit line 115-*b* so that the digit line voltage 525 tracks the capacitor bottom voltage.

At interval 545 the read voltage 505 may be applied so that the plate line voltage 520 reaches a threshold value. The initial logic state of the memory cell (e.g., sensed logic state of signal 340-*a* of FIG. 3) is sensed at interval 545. A threshold read value may be greater than a threshold write value used to write to the cell. Thus, when plate line voltage 520 is applied to the cell plate 210-*a*, the voltage across the capacitor 205-*a* may reach an equilibrium state or threshold value (e.g., voltage 530 or voltage 535 of FIG. 4), which may depend from a charge state 305-*a* or 305-*b*, and thus to a logic "0" or "1," as described with reference to FIG. 3.

At interval 550 the plate line voltage may be reset to zero (0V) by removing the read voltage 505. For example, the selection component 220-*a* may be deactivated such that capacitor 205-*a* is isolated from the digit line 115-*b*. Thus, isolation of capacitor 205-*a* may be based on the determination that the digit line voltage has reached a threshold value. Isolation may include interrupting a connection between a terminal of capacitor 205-*a* and digit line 115-*b*. Capacitor 205-*a* may be isolated from digit line 115-*b* prior to the activation of sense component 125-*b*.

At interval 555 the read voltage 505 may be re-applied such that plate line voltage 520 may again reach a threshold value. The value corresponding with the reference "0" state (e.g., reference "0" 345-*a* of FIG. 3) may be sensed at interval 555. This resulting value voltage 540-*a* may be sensed as described with respect to FIGS. 3 and 4. For example, the charge representative of reference "0" signal 345-*a* may be stored at sense capacitor 410. This charge may be sensed by activating transistor 425 and closing switching component 435 while opening switching components 430 and 440. The resulting charge may then be held at sense capacitor 410 by opening switching component 435.

At interval 560, a negative voltage 510 may be applied, resulting in charge state 325-*a* with reference to FIG. 3. At interval 560, the plate line may be grounded (0V) and the digit line voltage 525 may be biased to read voltage 505. After biasing the digit line voltage to read voltage 505, the digit line voltage 525 may grounded (0V) at interval 565, resulting in charge state 330-*a* with reference to FIG. 4. The read voltage 505 may then be re-applied such that plate line voltage 520 is again biased to read voltage 505.

The value corresponding with the reference "1" state (e.g., reference "1" 350-*a* of FIG. 3) may be sensed at interval 570. This resulting value voltage 540-*b* may be sensed as described with respect to FIGS. 3 and 4. For example, the charge representative of reference "1" signal 350-*a* may be stored at sense capacitor 415. This charge may be sensed by activating transistor 425 and closing switching component 440 while opening switching components 430 and 445. The resulting charge may then be held at sense capacitor 415 by opening switching component 440.

At interval 575, reference value voltage 540 is generated by providing the reference "0" value from interval 555 (e.g., value voltage 540-*a*) and the reference "1" value from interval 575 (e.g., value voltage 540-*b*). For example, reference value voltage 540 may be generated by averaging the reference "0" and reference "1" values by closing switching components 450 and 455 with reference to FIG. 4. These values are provided to a sense amplifier (e.g., sense component 125-*b* of FIG. 4) at interval 580 and a logic value is written back to the memory cell at interval 585.

Figure 6:
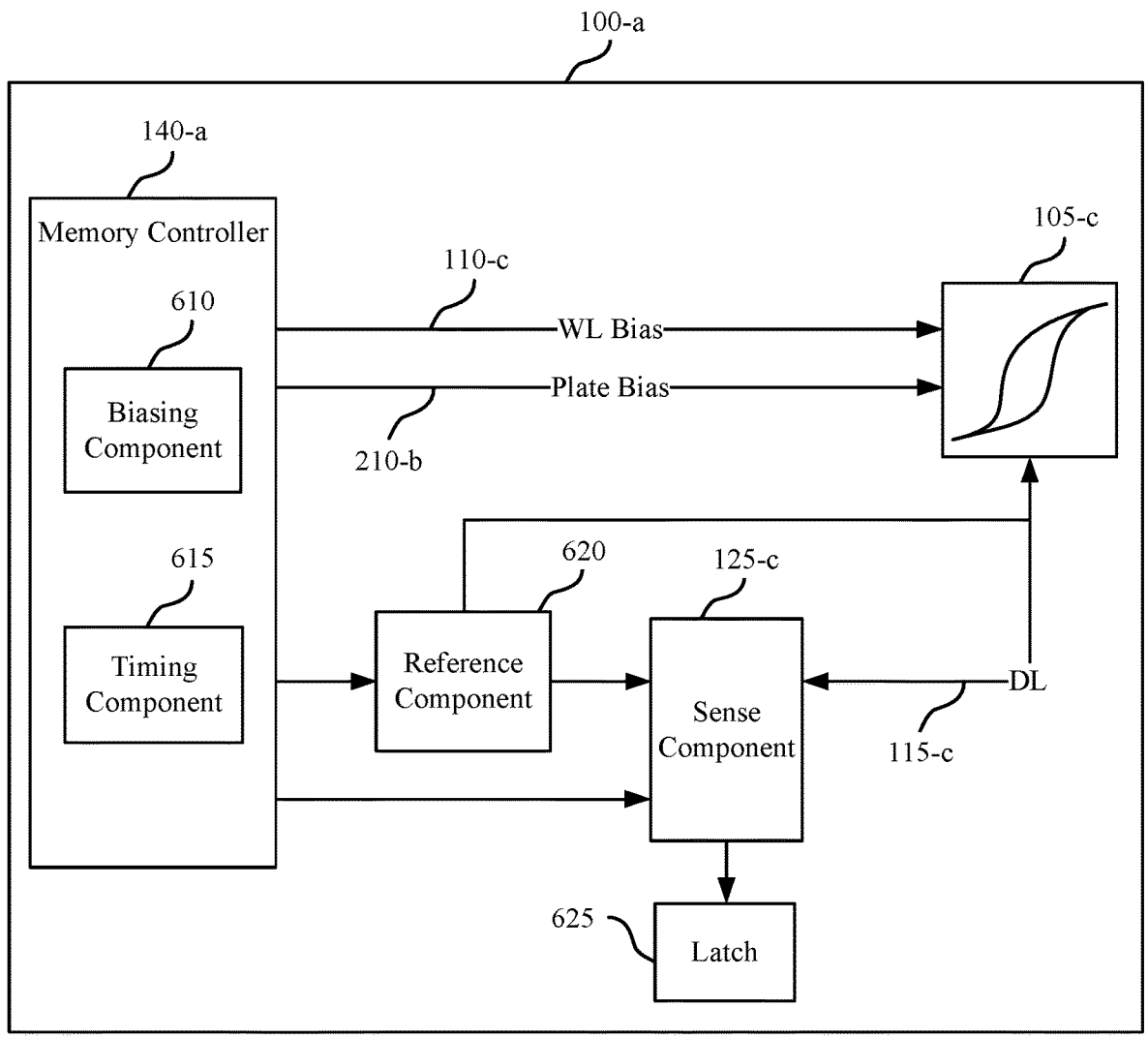
FIG. 6 illustrates an example ferroelectric memory array that supports self-referencing for ferroelectric memory in accordance with examples of the present disclosure.

FIG. 6 shows a block diagram 600 of a memory array 100-*a* that supports self-referencing for ferroelectric memory in accordance with various embodiments of the present disclosure. Memory array 100-*a* may be referred to as an electronic memory apparatus, and may be an example of a component of a memory controller 140 as described with reference to FIG. 1.

Memory array 100-*a* may include one or more memory cells 105-*c*, a memory controller 140-*a*, a word line 110-*c*, a plate 210-*b* line, a reference component 620, a sense component 125-*c*, a digit line 115-*c*, and a latch 625. These components may be in electronic communication with each other and may perform one or more of the functions described herein. In some cases, memory controller 140-*a* may include biasing component 610 and timing component 615. Memory controller 140-*a* may be in electronic communication with word line 110-*c*, digit line 115-*c*, sense component 125-*c*, and plate 210-*b* line 215, which may be examples of word line 110, digit line 115, sense component 125, and plate 210 line described with reference to FIGS. 1 and 2. In some cases, reference component 620, sense component 125-*c*, and latch 625 may be components of memory controller 140-*a*.

In some examples, digit line 115-*c* is in electronic communication with sense component 125-*c* and a ferroelectric capacitor of ferroelectric memory cells 105-*c*. A logic state (e.g., a first or second logic state) may be written to ferroelectric memory cell 105-*c*. Word line 110-*c* may be in electronic communication with memory controller 140-*a* and a selection component of ferroelectric memory cell 105-*c*. Plate 210-*b* line may be in electronic communication with memory controller 140-*a* and a plate of the ferroelectric capacitor of ferroelectric memory cell 105-*c*. Sense component 125-*c* may be in electronic communication with memory controller 140-*a*, digit line 115-*c*, latch 625, and reference line. Reference component 620 may be in electronic communication with memory controller 140-*a* and reference line. These components may also be in electronic communication with other components, both inside and outside of memory array 100-*a*, in addition to components not listed above, via other components, connections, or busses.

Memory controller 140-*a* may be configured to activate word line 110-*c*, plate 210-*b* line, or digit line 115-*c* by applying voltages to those various nodes. For example, biasing component 610 may be configured to apply a voltage to operate memory cell 105-*c* to read or write memory cell 105-*c* as described above. In some cases, memory controller 140-*a* may include a row decoder, column decoder, or both, as described with reference to FIG. 1. This may enable memory controller 140-*a* to access one or more memory cells 105-*c*. Biasing component 610 may also provide one or more voltages to reference component 620 in order to generate a reference signal for sense component 125-*c*. Additionally, biasing component 610 may provide a voltage for the operation of sense component 125-*c*.

In some cases, memory controller 140-*a* may perform its operations using timing component 615. For example, timing component 615 may control the timing of the various word line selections or plate biasing, including timing for switching and voltage application to perform the memory functions, such as reading and writing, discussed herein. In some cases, timing component 615 may control the operations of biasing component 610.

Reference component 620 may include various components to generate a reference signal for sense component 125-*c*. Reference component 620 may include circuitry configured to produce a reference signal. For example, reference component 620 may include plurality of sense capacitors in electronic communication with the digit line via a plurality of switching components (as shown in FIG. 4, for example). A first sense capacitor of the plurality may be coupled with the digit line via a first switching component and coupled with the sense component 125-*c* via a second switching component. A second sense capacitor of the plurality may be coupled with the digit line via a third switching component and coupled with the sense component 125-*c* via a fourth switching component. A third sense capacitor of the plurality may be coupled with the digit line via a fifth switching component and coupled with the sense component 125-*c* via a sixth switching component. In some cases, reference component 620 may be implemented using other ferroelectric memory cells 105-*c*.

The controller 140-*a* may be in electronic communication with the plurality of sense capacitors of reference component 620. The controller may be operable to control the first switching component, the third switching component, and the fifth switching component. For example, the controller 140-*a* may be operable to control the switching components to store a first charge associated with a first sense operation of the plurality at the first sense capacitor, store a second charge associated with a second sense operation of the plurality at the second sense capacitor, and store a third charge associated with a third sense operation of the plurality at the third sense capacitor. Memory controller 140-*a* may be operable to set a first condition of a memory cell after extracting a first charge associated with first sense operation. Memory controller 140-*a* may also be operable to set a second condition of the memory cell after extracting a second charge associated with the second sense operation and to reset the first condition of the memory cell after extracting the third charge associated with the third sense operation.

Sense component 125-*c* may compare a signal from memory cell 105-*c* (through digit line 115-*c*) with a reference signal from reference component 620. Upon determining the logic state, the sense component may then store a sensed voltage in latch 625, where it may be used in accordance with the operations of an electronic device that memory array 100-*a* is a part. Sense component 125-*c* may include a sense amplifier in electronic communication with the latch and the ferroelectric memory cell. Memory controller 140-*a* may thus be operable to control switching components of reference component 620 to determine a state of a memory cell with sense component 125-*c*. For example, memory controller 140-*a* may be operable to control the second switching component, the fourth switching component, and the sixth switching component to determine the reference voltage, and to compare the reference voltage and a sensed voltage of the additional sense operation in combination with sense component 125-*c*.

Memory controller 140-*a*, or at least some of its various sub-components may be implemented in hardware, software executed by a processor, firmware, or any combination thereof. If implemented in software executed by a processor, the functions of the memory controller 140-*a* and/or at least some of its various sub-components may be executed by a general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure. The memory controller 140-a and/or at least some of its various sub-components may be physically located at various positions, including being distributed such that portions of functions are implemented at different physical locations by one or more physical devices. In some examples, memory controller 140-a and/or at least some of its various sub-components may be a separate and distinct component in accordance with various embodiments of the present disclosure. In other examples, memory controller 140-a and/or at least some of its various sub-components may be combined with one or more other hardware components, including but not limited to a receiver, a transmitter, a transceiver, one or more other components described in the present disclosure, or a combination thereof in accordance with various embodiments of the present disclosure.

Memory controller 140-a may sense a first state of a ferroelectric memory cell, sense a second state of the ferroelectric memory cell after sensing the first state, and sense a third state of the ferroelectric memory cell after sensing the first state and the second state, where a logic value associated with the third state is opposite from a logic value associated with the second state. Memory controller 140-a may determine a logic value associated with the first state based on a comparison of the first state with an average of the second state and the third state. Averaging the second state and the third state may entail calculating a numerical average. Alternatively, averaging the second state and the third state may pertain to charge sharing. The memory controller 140-a may also apply a first voltage to a ferroelectric memory cell to initiate a set of sense operations, determine a reference voltage for the ferroelectric memory cell based on an average of two sense operations of the set, identify a signal that is a function of the reference voltage and a sensed voltage of an additional sense operation of the set of sense operations, and determine a logic state of the ferroelectric memory cell based on the signal.

Figure 7:
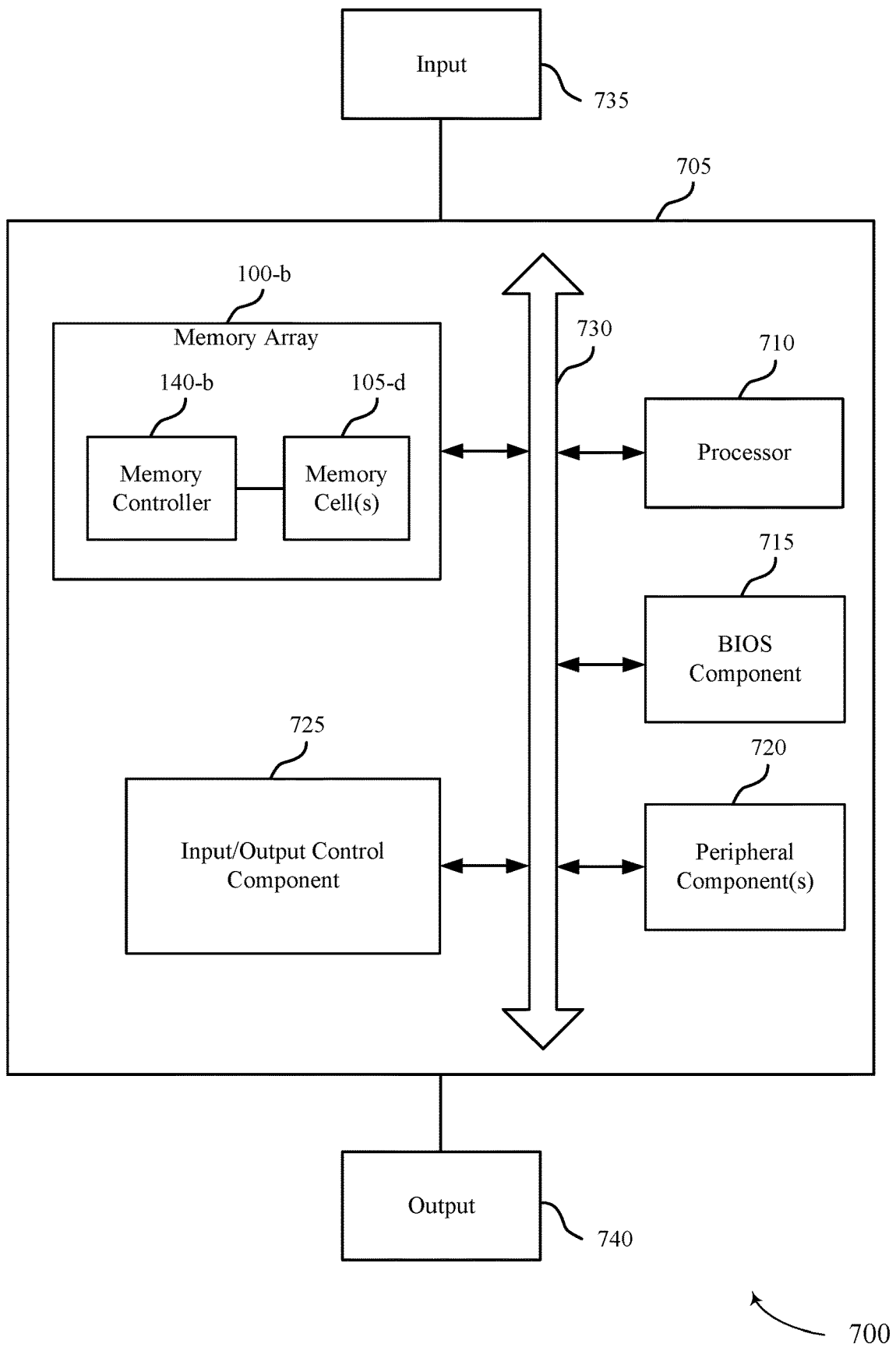
FIG. 7 illustrates a device, including a memory array, that supports self-referencing for ferroelectric memory in accordance with examples of the present disclosure.

FIG. 7 shows a diagram of a system 700 including a device 705 that supports self-referencing for ferroelectric memory in accordance with various embodiments of the present disclosure. Device 705 may be an example of or include the components of memory controller 140 as described above, with reference to FIG. 1. Device 705 may include components for bi-directional voice and data communications including components for transmitting and receiving communications, including memory array 100-b that includes memory controller 140-b and memory cells 105-d, basic input/output system (BIOS) component 715, processor 710, I/O controller 725, and peripheral components 720. These components may be in electronic communication via one or more busses (e.g., bus 730). Memory cells 105-d may store information (i.e., in the form of a logical state) as described herein.

BIOS component 715 may be a software component that includes BIOS operated as firmware, which may initialize and run various hardware components. BIOS component 715 may also manage data flow between a processor and various other components, for example, peripheral components, input/output control component, etc. BIOS component 715 may include a program or software stored in read only memory (ROM), flash memory, or any other nonvolatile memory.

Processor 710 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 710 may be configured to operate a memory array using a memory controller. In other cases, a memory controller may be integrated into processor 710. Processor 710 may be configured to execute computer-readable instructions stored in a memory to perform various functions (e.g., functions or tasks supporting self-referencing for ferroelectric memory).

I/O controller 725 may manage input and output signals for device 705. I/O controller 725 may also manage peripherals not integrated into device 705. In some cases, I/O controller 725 may represent a physical connection or port to an external peripheral. In some cases, I/O controller 725 may utilize an operating system such as iOS®, ANDROID®, MS-DOS®, MS-WINDOWS®, OS/2®, UNIX®, LINUX®, or another known operating system.

Peripheral components 720 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 735 may represent a device or signal external to device 705 that provides input to device 705 or its components. This may include a user interface or an interface with or between other devices. In some cases, input 735 may be managed by I/O controller 725, and may interact with device 705 via a peripheral component 720.

Output 740 may also represent a device or signal external to device 705 configured to receive output from device 705 or any of its components. Examples of output 740 may include a display, audio speakers, a printing device, another processor or printed circuit board, etc. In some cases, output 740 may be a peripheral element that interfaces with device 705 via peripheral component(s) 720. In some cases, output 740 may be managed by I/O controller 725

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or component of such a device.

Figure 8:
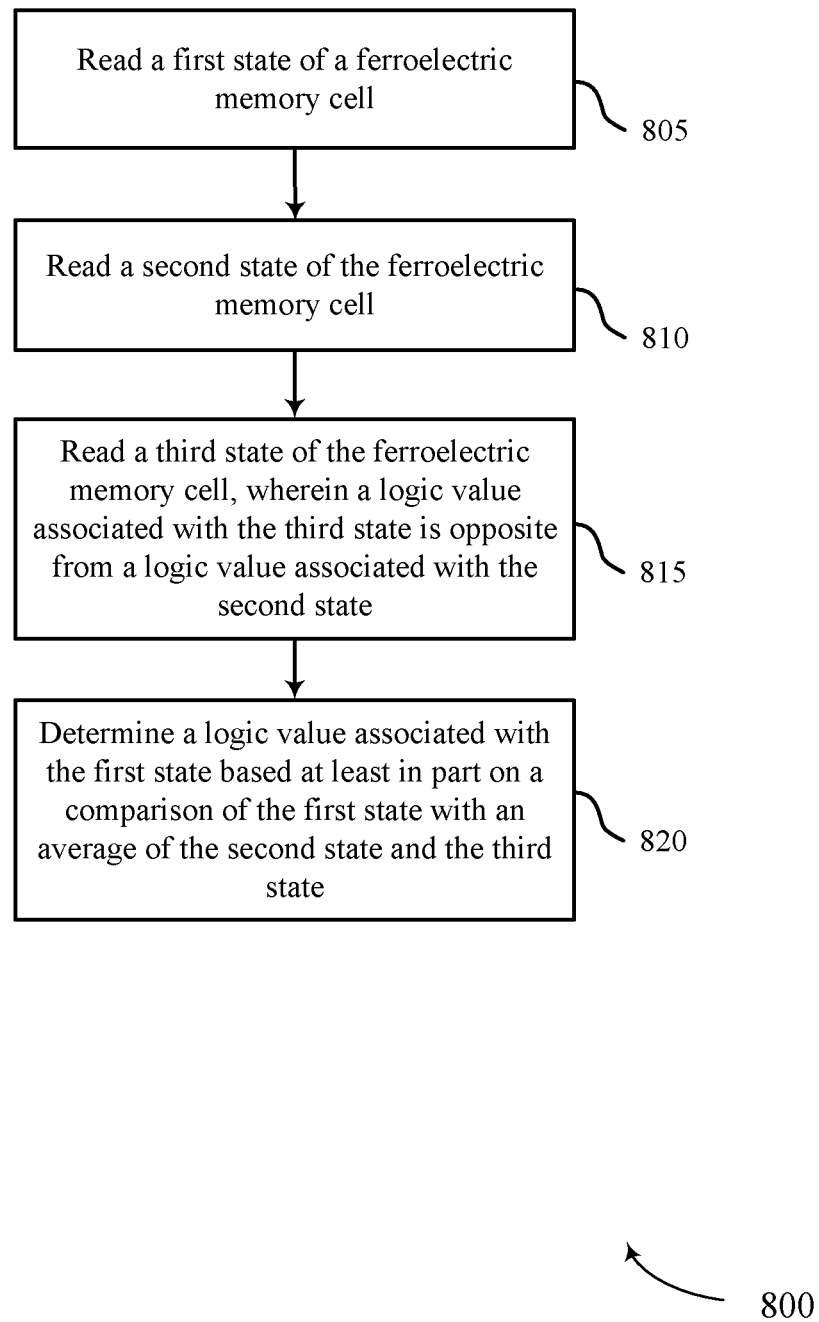
FIGS. 8-9 are flowcharts that illustrate a method or methods for self-referencing for ferroelectric memory in accordance with examples of the present disclosure.

FIG. 8 shows a flowchart illustrating a method 800 for self-referencing for ferroelectric memory in accordance with various embodiments of the present disclosure. The operations of method 800 may be implemented by a memory controller or its components as described herein. For example, the operations of method 800 may be performed by a memory controller as described with reference to FIG. 1. In some examples, a memory controller may execute a set of codes to control the functional elements of the device to perform the functions described below. Additionally or alternatively, the memory controller may perform some or all of the functions described below using special-purpose hardware.

At block 805, the method may include sensing a first state of a ferroelectric memory cell. The operations of block 805 may be performed by memory controller 140-a as described with reference to FIG. 6. In certain examples, the method may also include storing a first value associated with the first state.

At block 810 the memory controller may sense a second state of the ferroelectric memory cell after sensing the first state. The operations of block 810 may be performed by memory controller 140-*a* as described with reference to FIG. 6. In certain examples, the method may also include storing a second value associated with the second state after storing the first value.

At block 815 the memory controller may sense a third state of the ferroelectric memory cell after sensing the first state and the second state, wherein a logic value associated with the third state is opposite from a logic value associated with the second state. The operations of block 815 may be performed by memory controller 140-*a* as described with reference to FIG. 6. In certain examples, the method may also include storing a third value associated with the third state after storing the first value and the second value.

At block 820 the memory controller may determine a logic value associated with the first state based at least in part on a comparison of the first state with an average of the second state and the third state. The operations of block 820 may be performed by memory controller 140-*a* as described with reference to FIG. 6. In certain examples, the method may also include writing the logic value associated with the first state to the ferroelectric memory cell, wherein writing the logic value is based at least in part on the comparison of the first state with the average of the second state and the third state. In certain examples, the method may also include providing the stored first value as a first input to a sense component and providing the average of the stored second value and the stored third value as a second input to a sense component.

In further examples, the method may also include biasing the ferroelectric memory cell after storing the first value associated with the first state. The method may also include biasing the ferroelectric memory cell after storing the second value associated with the second state, wherein providing the average of the stored second value and the stored third value as the second input to the sense component is based at least in part on biasing the ferroelectric memory cell after storing the first value and the second value.

Figure 9:
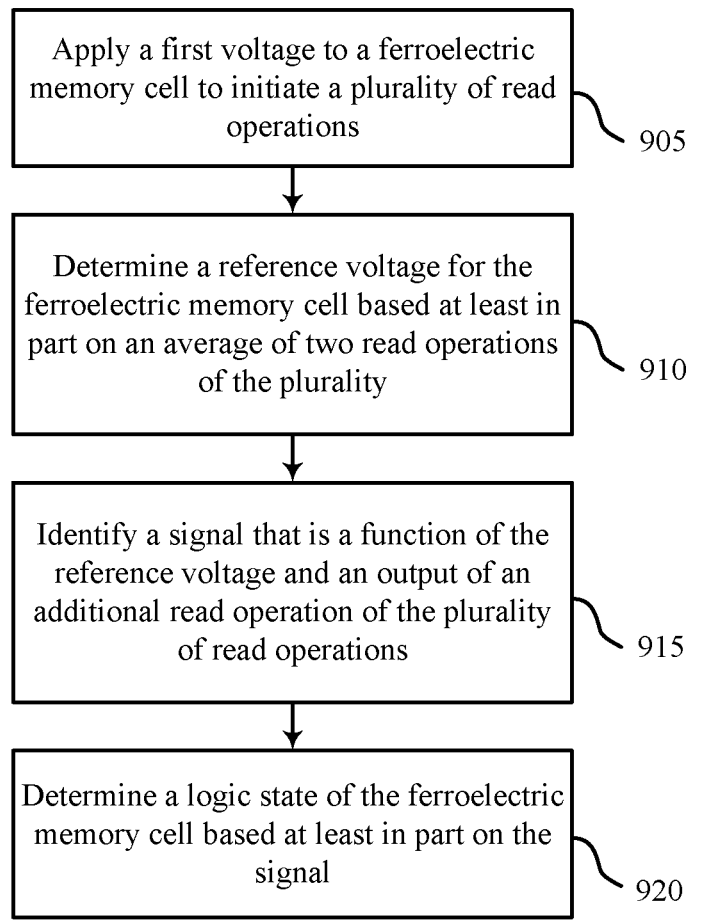

FIG. 9 shows a flowchart illustrating a method 900 for self-referencing for ferroelectric memory in accordance with various embodiments of the present disclosure. The operations of method 900 may be implemented by a memory controller or its components as described herein. For example, the operations of method 900 may be performed by memory controller 140-*a* as described with reference to FIG. 6. In some examples, a memory controller may execute a set of codes to control the functional elements of the device to perform the functions described below. Additionally or alternatively, the memory controller may perform some or all of the functions described below using special-purpose hardware.

At block 905 the memory controller may apply a first voltage to a ferroelectric memory cell to initiate a plurality of sense operations. Applying a voltage to the ferroelectric memory cell may initialize the ferroelectric memory cell to a first state or a second state. Applying a first voltage to initiate a plurality of sense operations may include applying the first voltage to the ferroelectric memory cell to extract a first charge form the ferroelectric memory cell. Applying the first voltage to initiate a plurality of sense operations may also include storing the first charge associated with the first sense operation at a first sense capacitor. In some instances, the memory controller may be able to set a first condition of the memory cell after extracting the first charge associated with the first sense operation.

At block 905 the memory controller may also apply a first voltage to initiate a plurality of sense operations that may include applying the first voltage to the ferroelectric memory cell to extract a second charge from the ferroelectric memory cell. Applying the first voltage to initiate a plurality of sense operations may also include storing the second charge associated with the second sense operation at a second sense capacitor. In some instances, the memory controller may be able to set a second condition of the memory cell after extracting the second charge associated with the second sense operation.

At block 905 the memory controller may also apply a second voltage to the ferroelectric memory cell, wherein the polarity of the second voltage is opposite of the polarity of the first voltage. The memory controller may remove the second voltage applied to the ferroelectric memory cell and may re-apply the first voltage to the ferroelectric memory cell to extract a third charge from the ferroelectric memory cell. Applying the first voltage may also include storing the third charge associated with the third sense operation at a third sense capacitor. In some instances, the memory controller may be able to reset the first condition of the memory cell after extracting the third charge associated with the third sense operation. The operations of block 905 may be performed by memory controller 140-*a* as described with reference to FIG. 6.

At block 910 the memory controller may determine a reference voltage for the ferroelectric memory cell based at least in part on an average of two sense operations of the plurality. The operations of block 910 may be performed by memory controller 140-*a* as described with reference to FIG. 6.

At block 915 the memory controller may identify a signal that is a function of the reference voltage and a sensed voltage of an additional sense operation of the plurality of sense operations. The operations of block 915 may be performed by memory controller 140-*a* as described with reference to FIG. 6.

At block 920 the memory controller may determine a logic state of the ferroelectric memory cell based at least in part on the signal. The operations of block 920 may be performed by memory controller 140-*a* as described with reference to FIG. 6.

It should be noted that the methods described above describe possible implementations, and that the operations and the steps may be rearranged or otherwise modified and that other implementations are possible. Furthermore, features or elements from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly connected with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication" and "coupled" refers to a relationship between components that supports electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolated" refers to a relationship between components in which electrons are not presently capable of flowing between them; components are isolated from each other if there is an open circuit between them. For example, two components physically connected by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the flow of charge between components (or lines) that are in electronic communication.

The devices discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
a ferroelectric memory cell that comprises a ferroelectric capacitor and a selection component, wherein the ferroelectric capacitor is selectively coupled with a digit line by activating the selection component;
a plurality of sense capacitors that are each selectively coupled with the digit line by controlling a respective switching component of a first set of switching components; and
a sense component that is selectively coupled with each sense capacitor of the plurality by controlling a respective switching component of a second set of switching components.

2. The apparatus of claim 1, wherein:
a first sense capacitor of the plurality is selectively coupled with the digit line by controlling a first switching component of the first set of switching components;
a second sense capacitor of the plurality is selectively coupled with the digit line by controlling a second switching component of the first set of switching components; and
a third sense capacitor of the plurality is selectively coupled with the digit line by controlling a third switching component of the first set of switching components.

3. The apparatus of claim 2, wherein:
the first sense capacitor of the plurality is selectively coupled with the sense component by controlling a first switching component of the second set of switching components;
the second sense capacitor of the plurality is selectively coupled with the sense component by controlling a second switching component of the second set of switching components; and
the third sense capacitor of the plurality is selectively coupled with the sense component by controlling a third switching component of the second set of switching components.

4. The apparatus of claim 3, wherein:
the first sense capacitor is selectively coupled with an input node of the sense component by controlling the first switching component of the second set of switching components; and
the second sense capacitor and the third sense capacitor are selectively coupled with a reference node of the sense component by controlling the second switching component and the third switching component of the second set of switching components.

5. The apparatus of claim 1, wherein the first set of switching components comprises a transistor connected in a series configuration with a plurality of other switching components, and wherein the plurality of other switching components are each connected in a series configuration with a sense capacitor of the plurality.

6. The apparatus of claim 5, wherein the digit line is selectively coupled with ground or virtual ground by controlling an additional switching component.

7. An apparatus, comprising:
a ferroelectric memory cell that comprises a ferroelectric capacitor and a selection component, the ferroelectric memory cell configured to store one or more charges indicative of one or more corresponding logic states;
a digit line configured to receive a charge of the one or more charges when coupled with the ferroelectric memory cell via the selection component;
a plurality of sense capacitors each configured to store the charge when respectively coupled with the digit line via a switching component of a first set of switching components; and
a sense component configured to receive the charge from one or more sense capacitors of the plurality of sense capacitors when coupled with the one or more sense capacitors via one or more switching components of a second set of switching components.

8. The apparatus of claim 7, further comprising:
a first sense capacitor of the plurality configured to receive a first charge indicative of a first logic state stored by the ferroelectric memory cell when coupled with the digit line via a first switching component of the first set of switching components, the one or more charges comprising the first charge;
a second sense capacitor of the plurality configured to receive a second charge indicative of a first reference logic state storable by the ferroelectric memory cell when coupled with the digit line via a second switching component of the first set of switching components, the one or more charges comprising the second charge; and a third sense capacitor of the plurality configured to receive a third charge indicative of a second reference logic state storable by the ferroelectric memory cell when coupled with the digit line via a third switching component of the first set of switching components, the one or more charges comprising the third charge.

9. The apparatus of claim 8, wherein the ferroelectric memory cell is configured to successively generate the first charge, the second charge, and the third charge on the digit line, the charge comprising one of the first charge, the second charge, or the third charge.

10. The apparatus of claim 8, further comprising:
a first switching component of the second set of switching components configured to selectively couple the first sense capacitor of the plurality with the sense component, the sense component configured to receive the first charge from the first sense capacitor when coupled;
a second switching component of the second set of switching components configured to selectively couple the second sense capacitor of the plurality with the sense component, the sense component configured to receive the second charge from the second sense capacitor when coupled; and
a third switching component of the second set of switching components configured to selectively couple the third sense capacitor of the plurality with the sense component, the sense component configured to receive the third charge from the third sense capacitor when coupled.

11. The apparatus of claim 10, wherein:
the first sense capacitor is selectively coupled with an input node of the sense component by controlling the first switching component of the second set of switching components, the input node configured to receive the first charge indicative of the first logic state stored by the ferroelectric memory cell; and
the second sense capacitor and the third sense capacitor are selectively coupled with a reference node of the sense component by controlling the second switching component and the third switching component of the second set of switching components, the reference node configured to receive a combination of the second charge indicative of the first reference logic state storable by the ferroelectric memory cell and the third charge indicative of the second reference logic state storable by the ferroelectric memory cell.

12. The apparatus of claim 7, wherein the first set of switching components comprises a transistor connected in a series configuration with one or more other switching components, and wherein the one or more other switching components are each connected in a series configuration with a sense capacitor of the plurality.

13. The apparatus of claim 12, wherein the digit line is selectively coupled with ground or virtual ground by controlling an additional switching component.

14. An apparatus, comprising:
a ferroelectric memory cell;
a digit line that is selectively coupled with the ferroelectric memory cell by activating a selection component;
a plurality of sense capacitors;
a first set of switching components, each of the first set of switching components coupled with the digit line and a sense capacitor of the plurality;
a sense component;
a second set of switching components, each of the second set of switching components coupled with the sense component and a sense capacitor of the plurality; and
a controller operable to:
couple the digit line with the ferroelectric memory cell to receive, at the digit line, a charge indicative of a logic state of the ferroelectric memory cell;
couple a sense capacitor of the plurality with the digit line to store the charge at the sense capacitor; and
couple the sense capacitor of the plurality with the sense component to receive, at the sense component, the charge.

15. The apparatus of claim 14, further comprising:
a first sense capacitor of the plurality that is selectively coupled with the digit line by controlling a first switching component of the first set of switching components;
a second sense capacitor of the plurality that is selectively coupled with the digit line by controlling a second switching component of the first set of switching components; and
a third sense capacitor of the plurality that is selectively coupled with the digit line by controlling a third switching component of the first set of switching components.

16. The apparatus of claim 15, wherein the controller is further operable to:
couple the first sense capacitor to the digit line via the first switching component of the first set of switching components to receive, at the first sense capacitor, a first charge indicative of a first logic state stored by the ferroelectric memory cell, the charge comprising the first charge;
couple the second sense capacitor to the digit line via the second switching component of the first set of switching components to receive, at the second sense capacitor, a second charge indicative of a first reference logic state storable by the ferroelectric memory cell; and
couple the third sense capacitor to the digit line via the third switching component of the first set of switching components to receive, at the third sense capacitor, a third charge indicative of a second reference logic state storable by the ferroelectric memory cell.

17. The apparatus of claim 16, further comprising:
a first switching component of the second set of switching components coupled with the first sense capacitor of the plurality and the sense component;
a second switching component of the second set of switching components coupled with the second sense capacitor of the plurality and the sense component; and
a third switching component of the second set of switching components coupled with the third sense capacitor of the plurality and the sense component.

18. The apparatus of claim 17, wherein the controller is further operable to:
couple the first sense capacitor with the sense component via the first switching component of the second set of switching components to receive, at the sense component, the first charge;
couple the second sense capacitor with the sense component via the second switching component of the second set of switching components to receive, at the sense component, the second charge;
couple the third sense capacitor with the sense component via the third switching component of the second set of switching components to receive, at the sense component, the third charge.

19. The apparatus of claim 18, wherein:
the first sense capacitor is coupled with an input node of the sense component, the input node configured to receive the first charge indicative of the first logic state stored by the ferroelectric memory cell; and the second sense capacitor and the third sense capacitor are coupled with a reference node of the sense component, the reference node configured to receive a combination of the second charge indicative of the first reference logic state storable by the ferroelectric memory cell and the third charge indicative of the second reference logic state storable by the ferroelectric memory cell.

20. The apparatus of claim 14, wherein the digit line is selectively coupled with ground or virtual ground by controlling an additional switching component.

* * * * *